United States Patent
Luan

(10) Patent No.: US 8,283,731 B2
(45) Date of Patent: Oct. 9, 2012

(54) ONE-TIME PROGRAMMABLE MEMORY

(75) Inventor: Harry Shengwen Luan, Saratoga, CA (US)

(73) Assignee: Kilopass Technologies, Inc., Santa Clara, CA (US)

( * ) Notice: Subject to any disclaimer, the term of this patent is extended or adjusted under 35 U.S.C. 154(b) by 190 days.

(21) Appl. No.: 12/802,206

(22) Filed: Jun. 2, 2010

(65) Prior Publication Data

US 2011/0298054 A1  Dec. 8, 2011

(51) Int. Cl.
*H01L 21/70* (2006.01)
(52) U.S. Cl. .......... 257/369; 257/E27.102; 257/E29.225
(58) Field of Classification Search ............ 257/369, 257/E27.102, E29.255
See application file for complete search history.

(56) References Cited

U.S. PATENT DOCUMENTS

| | | | |
|---|---|---|---|
| 6,667,902 B2 | 12/2003 | Peng | |
| 6,671,040 B2 | 12/2003 | Fong et al. | |
| 6,822,888 B2 | 11/2004 | Peng | |
| 2004/0195589 A1* | 10/2004 | Hsu et al. | 257/200 |

OTHER PUBLICATIONS

Brook Dale CC course notes on Transistor, http://ux.brookdalecc.edu/fac/engtech/andy/engi242/powerpoint/fets.pdf, 2004.*

* cited by examiner

*Primary Examiner* — Matthew Reames

(57) ABSTRACT

The present invention provides a programmable memory array including a plurality of memory cells. At least one and preferably each memory cell of the plurality of memory cells include an isolation layer formed of a dielectric material, a field effect transistor, and a programmable element. The programmable element includes a conductive gate, a gate insulator present beneath the conductive gate, and a semiconductor body present under the gate insulator. The semiconductor body of the programmable element is of a different doping type then the doping of the channel region of the field effect transistor. Apart from these components, the memory cell also includes a bit line connected to the source of the field effect transistor, a select word line connected to the gate of the field effect transistor and a program word line connected to the conductive gate of the programmable element.

16 Claims, 10 Drawing Sheets

| Operation | PWLm | SWLm | SWLn | PWLn | BLi | BLj |
|---|---|---|---|---|---|---|
| Program | Vpp | Vpp/2 or Vpp/3 | 0V | 0V-Vpp/2 | 0V | Vpp/2 or Vpp/3 |
| Read | Vread | Vdd | 0V | 0V-Vdd | 0V | Vdd |

FIG. 10

ONE-TIME PROGRAMMABLE MEMORY

FIELD OF THE INVENTION

The present invention relates, in general, to a non-volatile memory array and, more particularly, to an anti-fuse one-time programmable semiconductor memory cell.

BACKGROUND

Most of the computing and electronic devices manufactured nowadays use non-volatile memories for permanent storage of data. In these memories, data is not deleted even after the removal of the power supply. In other words, data once stored in these memories is retained irrespective of the status of the power supply to the memory.

Conventionally used non-volatile memories are read only memories (ROMs), programmable read only memories (PROMs), erasable programmable read only memories (EPROMs), one-time-programmable EPROMs, flash memories, and magneto-resistive read only memories (MRAM). Typically, a single non-volatile memory is made up of one or more memory arrays, which in turn are made up of many electrically programmable memory cells.

As commonly known, digital information is stored in a non-volatile memory in a combination of binary forms 'zero' or 'one'. This value ('zero' or 'one') is determined by the state of each memory cell included in the memory array of the non-volatile memory. To clearly understand the structure of a convention non-volatile memory, consider a memory made up of a single memory array and the memory array including many memory cells connected to each other. A portion of such a memory array 100 is shown in FIG. 1. Although memory array 100 is shown to include just four memory cells 102a, 102b, 102c, and 102d, it can include many more similar cells connected to each other. The state of each memory cell in memory array 100 is determined using bit line 'S', which is shown to be connected to the source terminals of all the transistors of the four memory cells.

As shown in FIG. 1, a single memory cell 102a includes a transistor 104 and a half transistor 106 (other memory cells also have the same structure). Transistor 104 is the 'select' transistor and is used to 'select' memory cell 102a during programming or read operations of memory cell 102a. Half transistor 106 is the programmable or data storage element of memory cell 102a. As depicted, the gate of transistor 104 is connected to a select line 'R1' and the gate of half transistor 106 is connected to a program line 'C1'. Whenever memory cell 102a is to be read, a potential is applied to C1, R1, and S, and the current flowing through 'S' depicts the state of memory cell 102a. For example, when memory cell 102a is in the 'high' state (or in a state corresponding to 'one'), voltages applied to C1, R1, and S result in a non-zero current in the bit line 'S'.

There are many known methods for programming a memory cell. In one such method, a high potential is applied to the gate dielectric layer of a transistor to cause its 'breakdown'. Half transistor 106 shown in FIG. 1 is an example of one such transistor whose gate dielectric can be broken down by applying a high potential across its gate dielectric layer. The process of programming a memory cell is disclosed in detail in the following patents: U.S. Pat. No. 6,667,902 'Semiconductor memory cell and memory array using a breakdown phenomena in an ultra-thin dielectric' issued Dec. 23, 2003 to Kilopass Technologies, Inc; U.S. Pat. No. 6,822,888 'Semiconductor memory cell and memory array using a breakdown phenomena in an ultra-thin dielectric' issued Nov. 23, 2004 to Kilopass Technologies, Inc; and U.S. Pat. No. 6,671,040 'Programming methods and circuits for semiconductor memory cell and memory array using a breakdown phenomena in an ultra-thin dielectric' issued Dec. 30, 2003 to Kilopass Technologies, Inc.

A detailed structure of a conventional one time programmable (OTP) memory cell 200 is shown in FIG. 2. As depicted, memory cell 200 includes an isolation layer 204 formed over a lightly doped P-type semiconductor substrate 202. Isolation layer 204 is assumed to be formed using silicon dioxide (SiO2) or many similar dielectric materials. Memory cell 200 further includes a field effect transistor 206 and a programmable element 208. Both field effect transistor 206 and programmable element 208 are enhancement MOS devices, and, as depicted, programmable element 208 is an MOS-type capacitor.

For description purposes, field effect transistor 206 is assumed to be an N-type transistor having a drain region 210, a source region 212, a gate insulator 214, and a conductive gate 216. As shown, drain region 210 and source region 212 are n+ doped regions, and gate insulator 214 is assumed to be an SiO2 layer overlying a channel region 218.

When a positive voltage is applied at conductive gate 216 (or in other words, when memory cell 200 is 'selected'), an inversion layer 220 is formed at the upper surface of channel region 218. Inversion layer 220 electrically connects drain region 210 with source region 212, thus allowing the flow of electrons from source region 212 to drain region 210. Further, as shown, a bit line 222 (which is similar to bit line 'S' of FIG. 1) is connected to source region 212, and a select word line 224 (which is similar to select line 'R1' of FIG. 1) is connected to conductive gate 216. To 'select' transistor 206, proper voltages are applied to select word line 224 and program word line 232, and whenever current flows through inversion layer 220, a non-zero current flows through bit line 222, indicating that memory cell 200 is in the 'high' state or 'one' logic.

Further, as shown in FIG. 2, programmable element 208 has a semiconductor body 226, an insulating layer 228, and a conductive layer 230. Insulating layer 228 is assumed to be made of SiO2 (similar to gate insulator 214). Typically, the thickness of insulating layer 228 is the same or less than the thickness of gate insulator 214.

As shown, a program word line 232 is connected to conductive layer 230, which can be made of poly silicon or any other high conductive material. During programming or read operation of memory cell 200, a positive voltage is applied to conductive layer 230 through program word line 232. Typically, to program memory cell 200 as a permanent 'high' (state corresponding to logic 'one'), a high voltage is applied to conductive layer 230 which causes insulating layer 228 to 'breakdown' permanently. After the breakdown process is over, whenever a voltage is applied to conductive layer 230, a current starts to flow through programmable element 208 to drain 210 and finally to source 212. In this case, a conductive path is provided through insulating layer 228 for the flow of charge carriers.

The structure of memory cell 200 described above has a drawback. An effective p-n junction diode is formed at the breakdown site under conductive gate 230. Due to this, degradation of the memory cell takes place when the high voltage is applied to conductive layer 230 during programming.

In light of the drawback mentioned above, there is a need for an OTP memory cell which overcomes the limitation of the conventional memory cell without added process cost, i.e. the fabrication of the memory cell should preferably follow standard CMOS process.

SUMMARY OF THE INVENTION

According to an embodiment of the present invention, a one-time programmable memory array is provided. The one time programmable memory array includes a plurality of memory cells. Each memory cell includes an isolation layer formed of a dielectric material. An example of a dielectric material includes, but is not limited to, silicon oxide (SiO2). The memory cell also includes a field effect transistor, which in turn includes a first semiconductor region and a second semiconductor region formed over the isolation layer. In accordance with an embodiment of the present invention, the first and the second semiconductor regions are of n-type conductivity. The first semiconductor region is the source region, and the second semiconductor region is the drain region of the field effect transistor.

The field effect transistor further includes a channel region of, in this example, p-type conductivity formed between the first semiconductor region and the second semiconductor region. The field effect transistor also includes a first gate insulator and a first conductive gate. The first gate insulator is formed over the channel region, and the first conductive gate is formed over the first gate insulator.

The memory cell includes a programmable element which includes a third semiconductor region of, in this example, n-type conductivity. The second semiconductor region (which is the drain region of the field effect transistor) is also a part of the programmable element. In other words, the second semiconductor region is shared between the programmable element and the field effect transistor. The programmable element also includes a semiconductor body present between the second semiconductor region and the third semiconductor region. In accordance with an embodiment of the present invention, the third semiconductor region and the semiconductor body are formed over the isolation layer. Also, the doping of the semiconductor body is of a different type as compared to the doping of the channel region of the field effect transistor. For example, if the channel region is of p-type conductivity, the semiconductor body is either of n-type conductivity or undoped.

The programmable element also includes a second gate insulator overlaying the semiconductor body and a second conductive gate present over the second gate insulator.

In addition, the memory cell includes a bit line in contact with the first semiconductor region, a select word line coupled to the first conductive gate, and a program word line coupled to the second conductive gate.

In accordance with another embodiment of the present invention, a one-time programmable memory array is provided. The one-time programmable memory array includes a plurality of memory cells. Each memory cell includes an isolation layer formed of a dielectric material, such as SiO2. The memory cell also includes a field effect transistor, which includes a first semiconductor region and a second semiconductor region formed over the isolation layer. The first and the second semiconductor regions are, in this example, of n-type conductivity, and in accordance with an embodiment of the present invention, the first and second semiconductor regions are drain and source regions, respectively, of the field effect transistor.

The field effect transistor also includes a channel region of, in this example, p-type conductivity formed between the first and the second semiconductor region. The field effect transistor also includes a gate insulator present over the channel region and a first conductive gate present over the gate insulator.

The memory cell includes a programmable element that includes a third region present over the isolation region. The third region is made of a dielectric material, such as SiO2. The second semiconductor region, which is the drain of the field effect transistor, is also a part of the programmable element. The programmable element also includes a semiconductor body present over the isolation layer and between the second semiconductor region and third region. In accordance with an embodiment of the present invention, the doping of the semiconductor body is different from the doping of the channel region of the field effect transistor.

The programmable element further includes an insulator layer present over the semiconductor body, and a second conductive gate present over the insulator layer.

In addition to the components mentioned above, the memory cell includes a bit line in contact with the first semiconductor region, a select word line coupled to the first conductive gate of the field effect transistor, and a program word line coupled to the second conductive gate of the programmable element.

An objective of the present invention is to provide a memory cell which results in a better programming and does not get degraded over time due to the formation of an effective p-n junction diode in the programmable element of the memory cell.

Another objective of the present invention is to provide a memory cell which accomplishes the above mentioned objective, and which preferably can be fabricated using standard CMOS processing.

BRIEF DESCRIPTION OF THE DRAWINGS

The preferred embodiments of the invention will hereinafter be described in conjunction with the appended drawings provided to illustrate, and not to limit, the invention, wherein like designations denote like elements, and in which:

FIG. 10 is a table illustrating a set of voltages for an OTP memory cell, in accordance with an embodiment of the present invention.

DETAILED DESCRIPTION OF THE INVENTION

Figure 1:
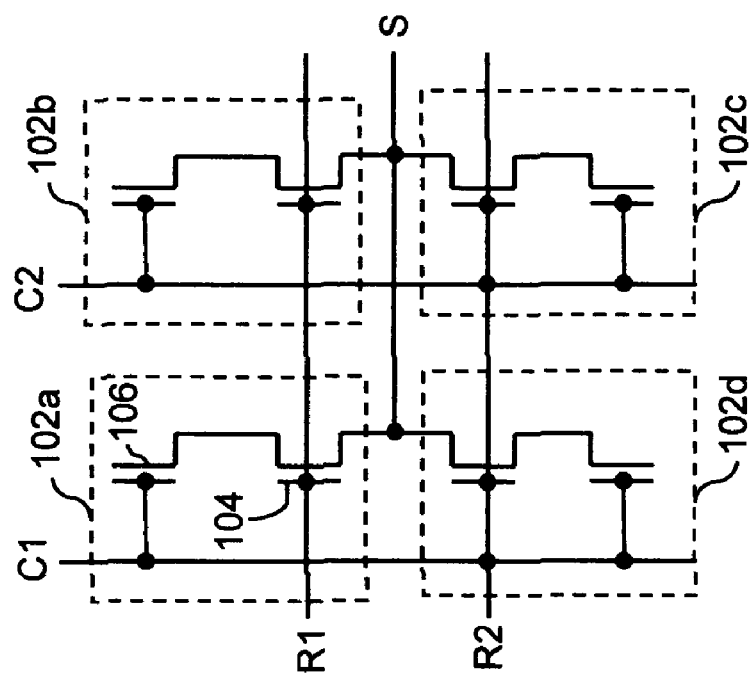
FIG. 1 is a conventional memory array.
Figure 2:
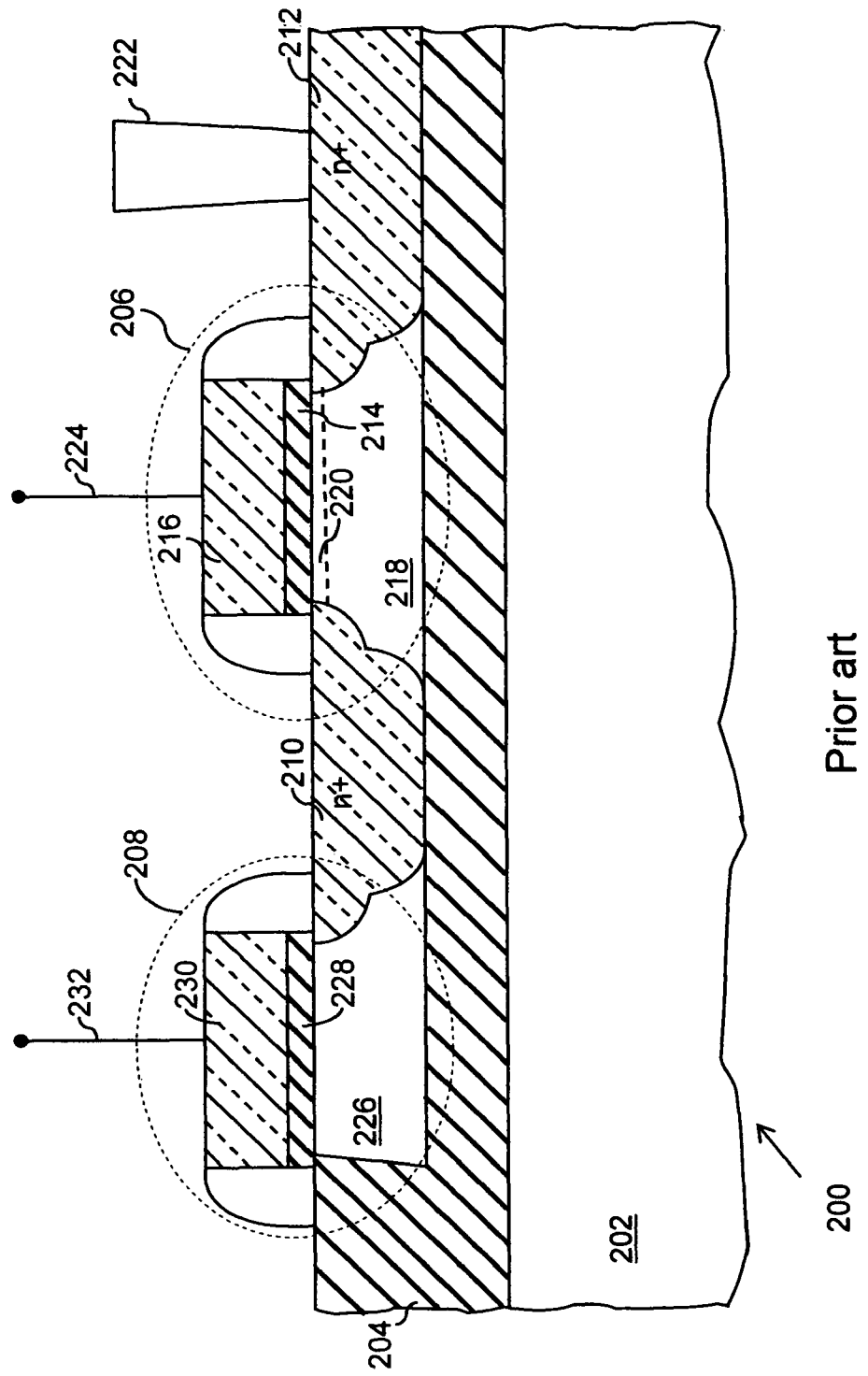
FIG. 2 illustrates a cross section of a prior art OTP memory cell.
Figure 3:
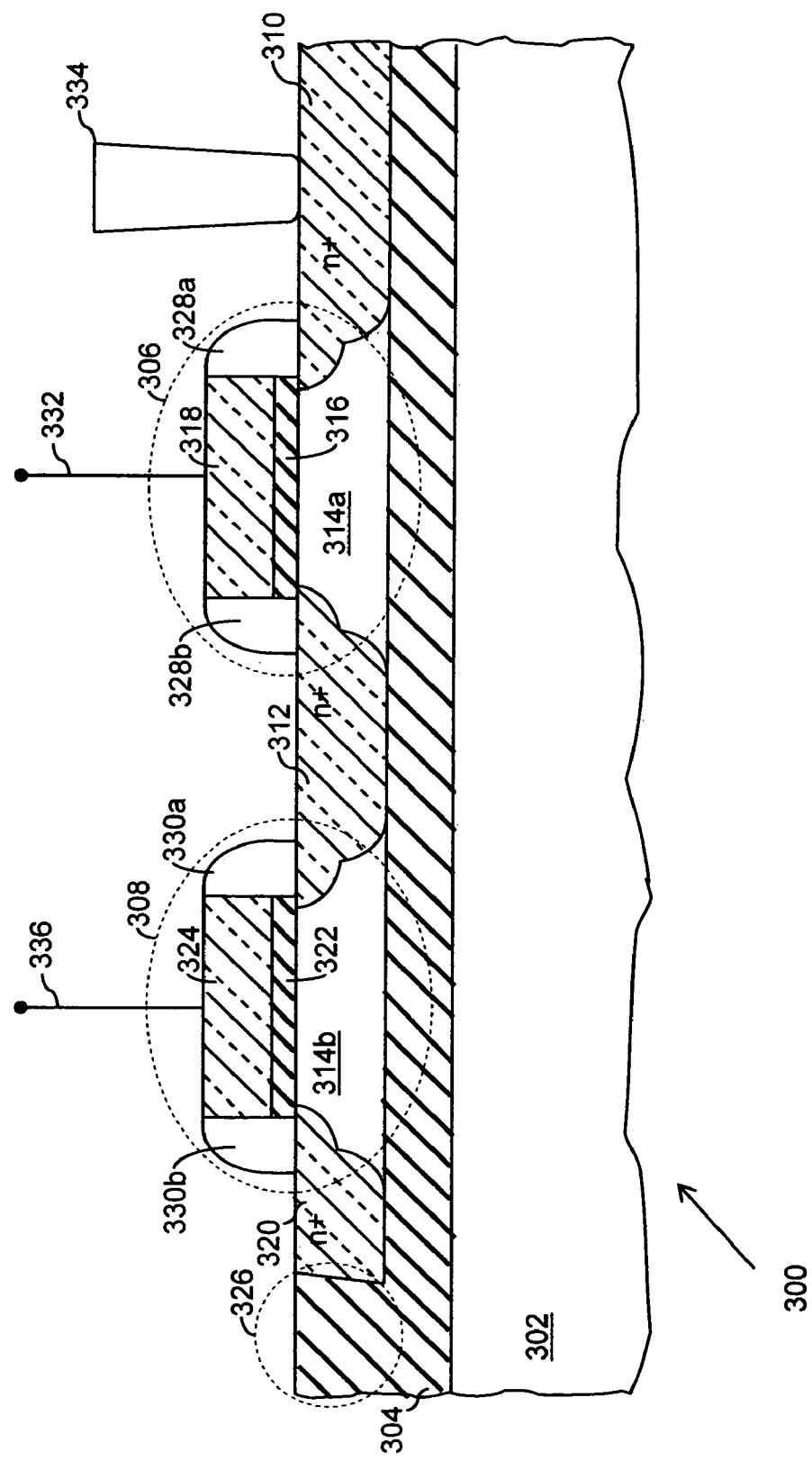
FIG. 3 illustrates a cross section of an OTP memory cell, in accordance with an embodiment of the present invention.

In accordance with an embodiment of the present invention, FIG. 3 illustrates a cross section of an OTP memory cell 300 formed in a silicon-on-insulator wafer. Memory cell 300 includes an isolation layer 304 present over a supporting substrate 302 which can be made of a doped or an undoped semiconducting material. For certain applications, the doping concentration of semiconducting substrate 302 can be, for example, in the range of $1\times10^{12}$ to $1\times10^{14}$ per cm$^3$, and isolation layer 304 can be formed by using silicon dioxide (SiO2) or any other similar dielectric materials.

Those ordinarily skilled in the art will appreciate that semiconducting substrate 302 can be of n-type conductivity as well as of p-type conductivity. However, for description purposes in the rest of this application, it is assumed that substrate 302 is of p-type conductivity.

As shown in FIG. 3, memory cell 300 includes an enhancement metal-oxide-semiconductor (MOS) field effect transistor 306 and a programmable element 308. Field effect transistor 306 includes a source region 310 and a drain region 312. In accordance with an embodiment of the present invention, source region 310 and drain region 312 are of n-type conductivity, and their doping concentration is in the range of $1\times10^{15}$ to $5\times10^{15}$/cm$^3$. Between these two regions, field effect transistor 306 includes a body region 314a, which acts as a channel region of field effect transistor 306. Body region 314a is of the opposite doping type as source region 310 and drain region 312.

Field effect transistor 306 also includes a gate insulator 316 and a conductive layer 318 present over it. Gate insulator 316 can be, for example, an oxide layer and its thickness can be in the range of 8 Å to 80 Å. Conductive layer 318 is made of poly-silicon and/or an n+ semiconductor material. Those ordinarily skilled in the art will know that conductive layer 318 acts as the gate of field effect transistor 306 and therefore can be made of metals, semimetals, or other doped semiconducting materials.

As already mentioned, memory cell 300 also includes programmable element 308. In accordance with an embodiment of the present invention, programmable element 308 is an MOS capacitor. It includes an n+ semiconductor region 320, which has doping concentration in the range of $1\times10^{15}$ to $5\times10^{15}$/cm$^3$. As apparent from FIG. 3, drain region 312 (of field effect transistor 306) is a part of programmable element 308 as well. In other words, drain region 312 is shared by field effect transistor 306 and programmable element 308.

Between drain region 312 and semiconductor region 320, programmable element 308 includes a body region 314b. In accordance with an embodiment of the present invention, the doping type of body region 314b is different from the doping type of body region 314a. Typically, body region 314b is of n-type conductivity (i.e., body region 314b is an n-well) if body region 314a is of p-type conductivity. In accordance with another embodiment of the present invention, body region 314b is undoped, irrespective of the doping type of body region 314a (in the present case, body region 314a is assumed to be of p-type conductivity as field effect transistor 306 is assumed to be an NMOS device).

Programmable element 308 also includes an insulating layer 322 present over body region 314b, and a conductive layer 324 present over insulating layer 322. Insulating layer 322 can be, for example, an oxide layer, and conductive layer 324 can be made of, for example, poly silicon and/or other conductive materials such as metals. In accordance with an embodiment of the present invention, the thickness of insulating layer 322 is either the same or less than the thickness of gate insulator 316. For example, the thickness of insulating layer 322 can be in the range of 8 Å to 40 Å.

Those ordinarily skilled in the art will appreciate that conductive layer 324 of programmable element 308 acts as the first plate of a capacitor, while body region 314b acts as the second plate of the capacitor. The two plates are separated from each other by insulating layer 322. According to one embodiment of the present invention, programmable element 308 is an n+ poly/n-well capacitor.

The structure of programmable element 308, as described above, is different from the structure of conventional memory cells in at least one aspect. If body region 314b is of n-type conductivity, no p-n junction is formed in the present invention (since both body region 314b and conductive layer 324 are either of n-type conductivity or have no doping at all). Therefore, all effects associated with a p-n junction present in a conventional memory cell are not present in memory cell 300. In the case of an un-doped body 314b, the p-n diode formed after programming has a higher quality factor since only a low grade p-n junction is formed and therefore endures less degradation during programming.

Apart from the components described above, memory cell 300 also includes a vertically extended dielectric region 326 adjacent to semiconductor region 320. Dielectric region 326 is extended to isolation region 304 and is made of the same material, such as SiO2. Structurally, it can be said that dielectric region 326 is a vertical extension of isolation region 304. This extension is typically made to isolate memory cell 300 with an adjacent memory cell (not shown) which is made on the same isolation region 304. A person ordinarily skilled in the art can easily recognize that isolation region 326 can be a standard Shallow Trench Isolation (STI) in SOI processes.

Similar to conventional MOS field effect transistors and MOS capacitors, field effect transistor 306 and programmable element 308 also includes spacers 328a, 328b and 330a, 330b. The structure and use of spacers are well known in the art and will not be described here for the sake of simplicity.

In addition, similar to conventional memory cells, memory cell 300 includes a select word line (SWL) 332 connected to conductive layer 318, a bit line (BL) 334 connected to source region 310 of field effect transistor 306, and a program word line (PWL) 336 connected to conductive layer 324 of programmable element 308. For programming or read operations of memory cell 300, voltages are applied to these three lines of memory cell 300. These two operations of memory cell 300 are described below.

In accordance with an embodiment of the present invention, to program memory cell 300 and to store a permanent 'one', programmable element 308 (MOS capacitor) is biased in an accumulation mode. The voltages applied to the three lines are such that the potential difference across insulating layer 322 is sufficient to cause its breakdown. In this case, insulating layer 322 acts as an 'anti-fuse' for memory cell 300. The programming operation of a memory cell with different examples of voltages is explained later with reference to FIG. 9 and FIG. 10.

Those ordinarily skilled in the art will know that breakdown in conventional memory cells is position dependent due to the presence of a p-type body under insulating layer 322 (in other words, due to the formation of an n-type inversion channel under positive gate bias condition). However, in the case of the present invention, since body region 314b is of n-type conductivity or is undoped, post breakdown conductance of the anti-fuse is significantly less position dependent. This is because the charge carriers experience less resistance in their flow from conductive layer 324 to drain region 312 through body region 314b (which is not the case in conventional memory cells where body region was of p-type conductivity).

During the read operation of memory cell 300, a voltage is first applied to SWL 332 to 'select' memory cell 300. This causes field effect transistor 306 to turn 'ON', and thus an inversion layer is formed under gate insulator 316. Thereafter, if memory cell is programmed to be a permanent 'one', whenever a voltage is applied to PWL 336, a current flows from conductive layer 324 through body region 314b (which is either n-type doped or undoped) to drain region 312. From drain region 312, the current flows through the formed inversion layer to source region 310. Now, when the current flows to source region 310, a non-zero current is sensed in BL 334, indicating a state 'one' of memory cell 300.

If memory cell 300 is programmed to be a permanent 'zero', i.e., when the programmable element is not broken down, only a very small direct tunneling current flows to BL 334 indicating a state 'zero' of memory cell 300.

Region 320 helps in maintaining the symmetry of the device, which in turn helps in estimating the parasitic resistance and capacitance offered by the device.

Figure 4:
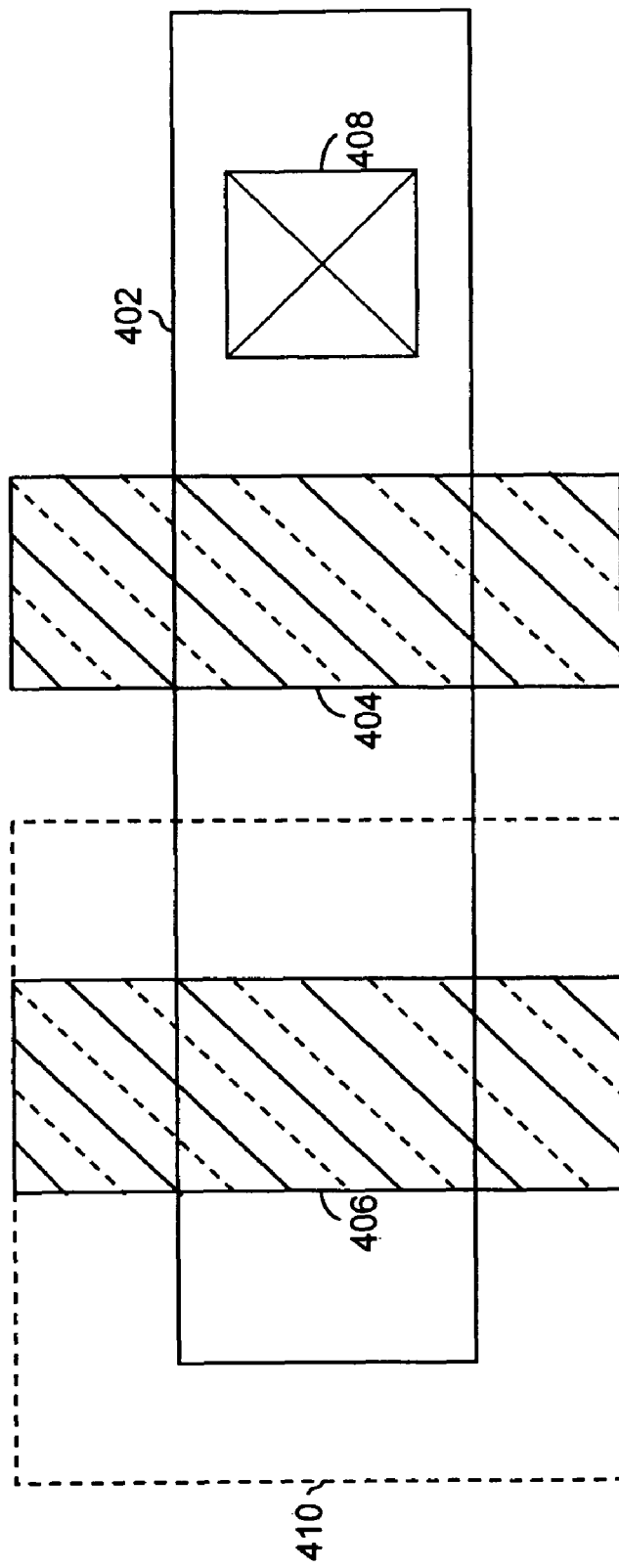
FIG. 4 illustrates a layout of the OTP memory cell shown in FIG. 3, in accordance with an embodiment of the present invention.

FIG. 4 illustrates a layout of memory cell 300, in accordance with an embodiment of the present invention. The channel region of field effect transistor 306 is present at the area which is at a cross section of mask 402, which is the active region mask of memory cell 300, and a first poly mask 404. Similarly, the body region of programmable element 308 is present at the area which is at a cross section of active region mask 402 and a second poly mask 406. A contact mask 408 is also shown in FIG. 4 which depicts the contact of bit line 334 with the source of field effect transistor 306.

Apart from the regions mentioned above, FIG. 4 also shows a mask 410 over a section of active region of memory cell 300. Mask 410 is used to 'block' regular p-well and NMOS threshold adjustment implants, which are performed on the active region during the formation of field effect transistor 306 of memory cell 300 in a regular CMOS flow. Afterwards, the region under mask 410 is implanted with n-type doping to form the n-well (body region 314b) of the MOS capacitor (programmable element 308). Subsequently, all the other steps associated with the fabrication of a conventional memory cell takes place, i.e., the formation of n+-poly gate conductive layer, n− LDD regions, spacers, n+ drain and source implants, etc.

Figure 5:
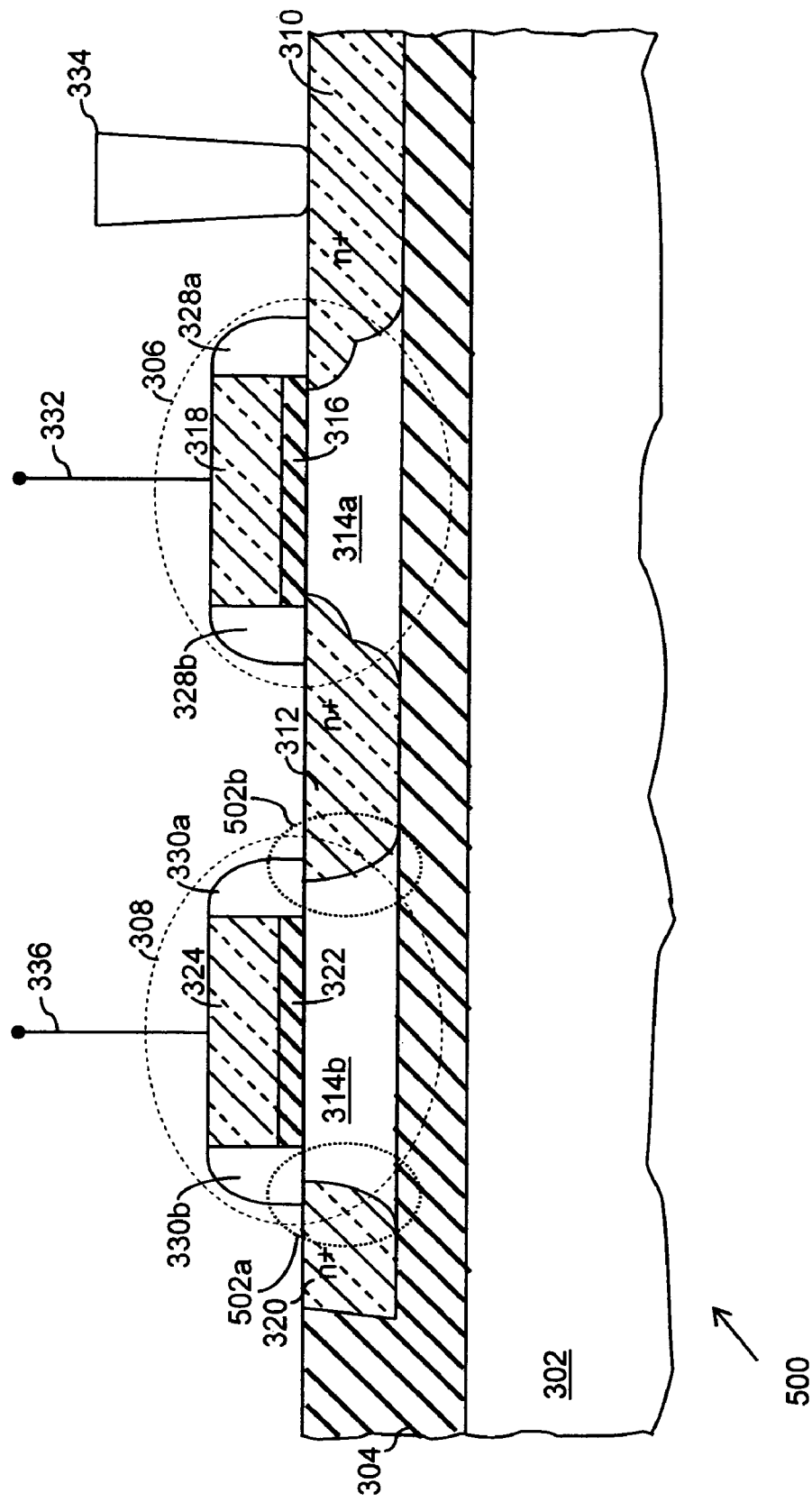
FIG. 5 illustrates a cross section of an OTP memory cell, in accordance with another embodiment of the present invention.

FIG. 5 illustrates a cross section of an OTP memory cell 500, in accordance with another embodiment of the present invention. Memory cell 500 is structurally different from memory cell 300 in at least one aspect. That is, the shape of semiconductor region 320 and drain region 312 under spacers 330b and 330a in areas 502a and 502b is different from the shape depicted in FIG. 3. Those ordinarily skilled in the art will know that the shape of these regions, as shown in FIG. 5, is achieved by masking the LDD and halo implants performed under insulating layer 322 for the formation of drain region 312 and semiconductor region 320. One advantage of this embodiment is that the masking of LDD and halo implants (and the formation of the shapes as shown in FIG. 5) provides a uniform doping concentration of charge carriers in body region 314b. The other advantage of this embodiment, which will be apparent to a person ordinarily skilled in the art, is that insulating layer 322 becomes less prone to damages by junction implants performed after the formation of conductive gate 324.

The layout of memory cell 500 is same as the layout of memory cell 300, and hence it is not shown again for the sake of simplicity.

Figure 6:
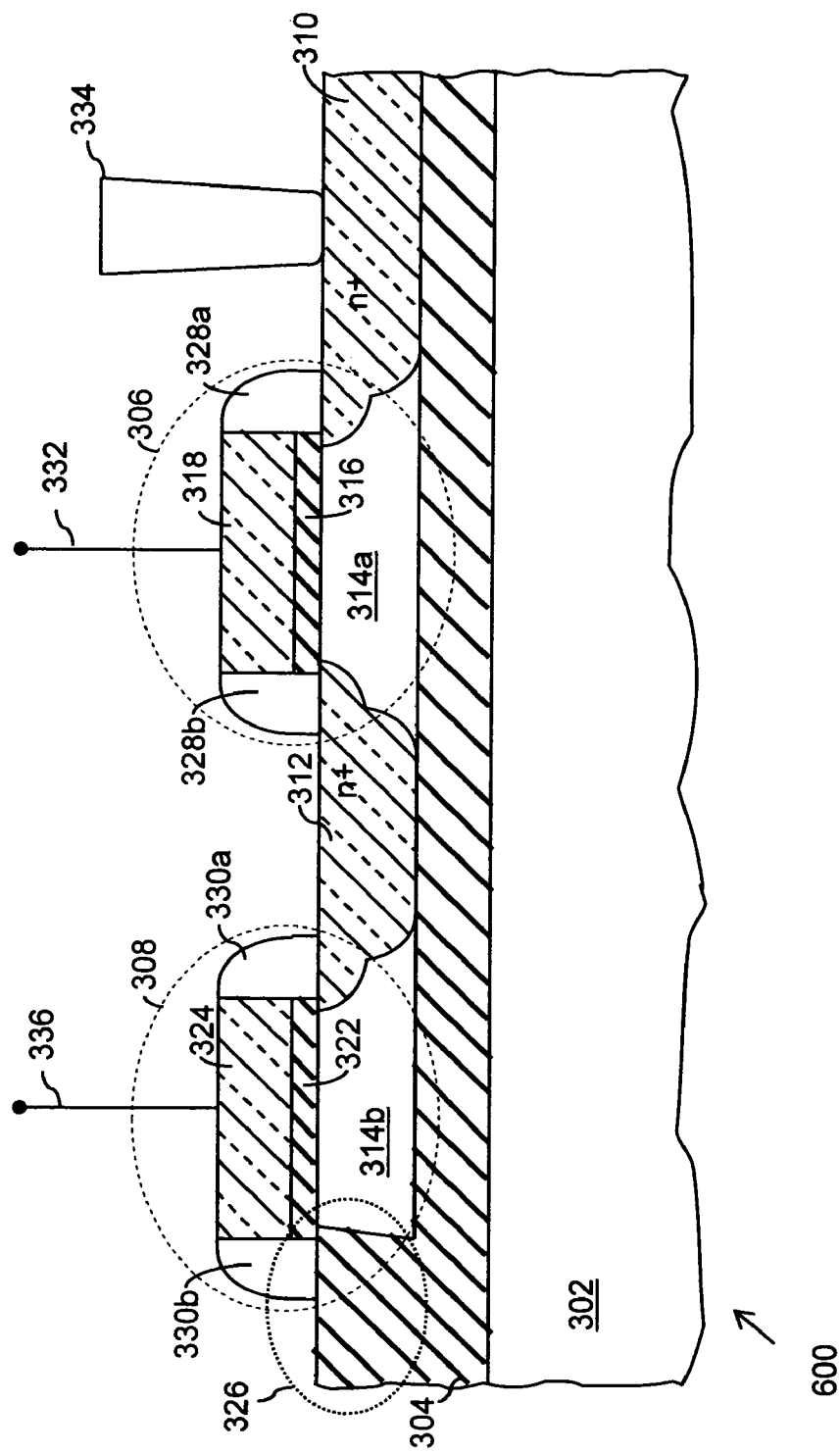
FIG. 6 illustrates a cross section of an OTP memory cell, in accordance with yet another embodiment of the invention.

FIG. 6 illustrates a cross section of an OTP memory cell 600, in accordance with yet another embodiment of the invention. As apparent from FIG. 6, memory cell 600 is structurally similar to memory cell 300, the major difference being that memory cell 600 does not include semiconductor region 320 present under spacer 330b. In memory cell 600, the vertically extended region 326 of isolation layer 304 is present under spacer 330b and is located where semiconductor region 320 was in memory cell 300. All the other components of memory cell 600 are the same as that of memory cell 300 and the description of these components will not be provided here again.

The advantage of memory cell 600 over memory cell 300 is that it is compact in size, and thus provides high packing density for the memory array utilizing memory cell 600.

Figure 7:
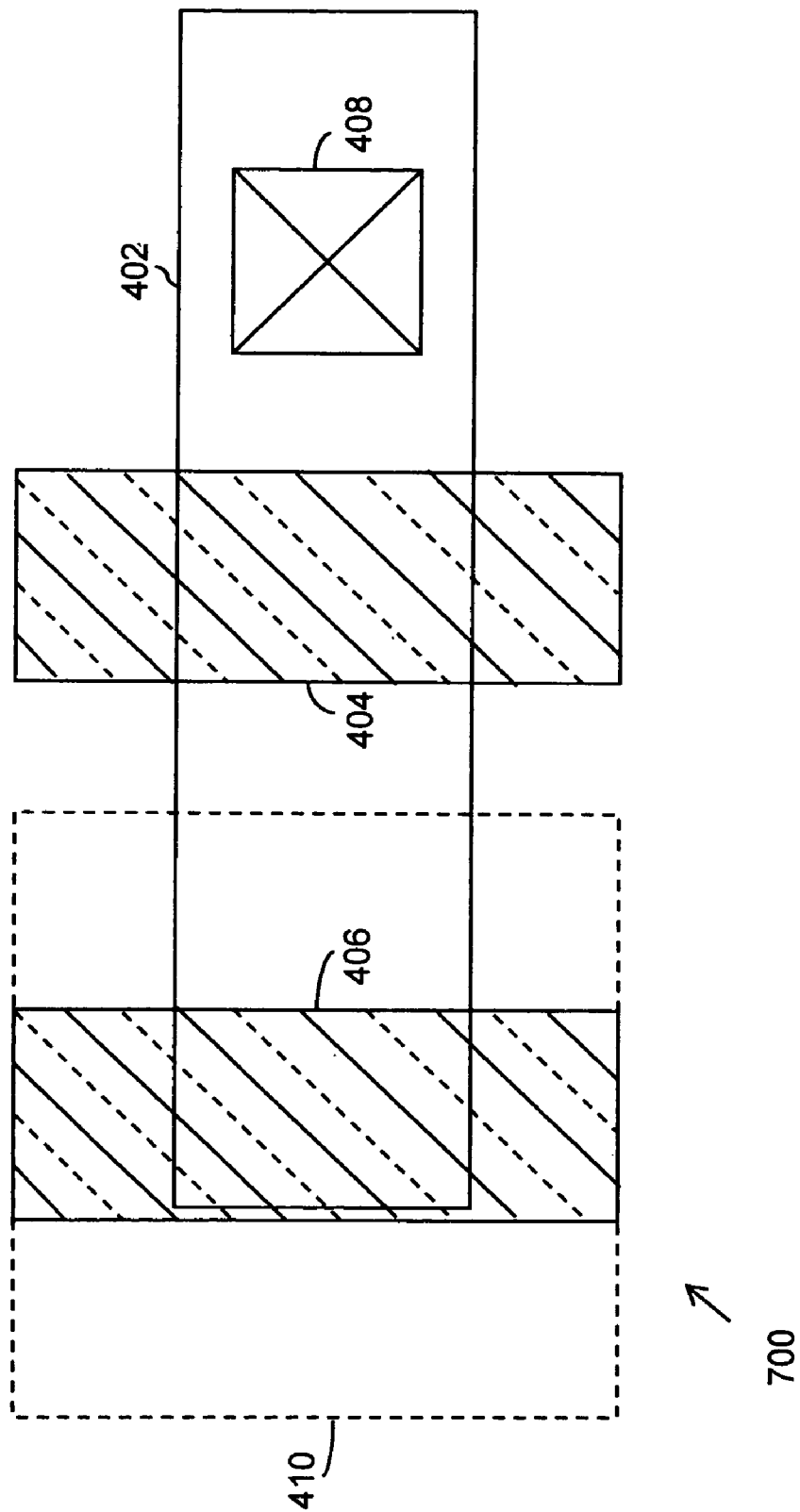
FIG. 7 illustrates a layout of the memory cell shown in FIG. 6, in accordance with an embodiment of the present invention.

FIG. 7 illustrates a layout of memory cell 600, in accordance with an embodiment of the present invention. The layout of memory cell 600 is similar to the layout of memory cell 300, the major difference being that active region mask 402 does not extend past second poly mask 406. This is because semiconductor region 320 is not present in memory cell 600 and that region is substituted by the vertically extended region 326 of isolation layer 304 (which is not a part of the active region).

Figure 8:
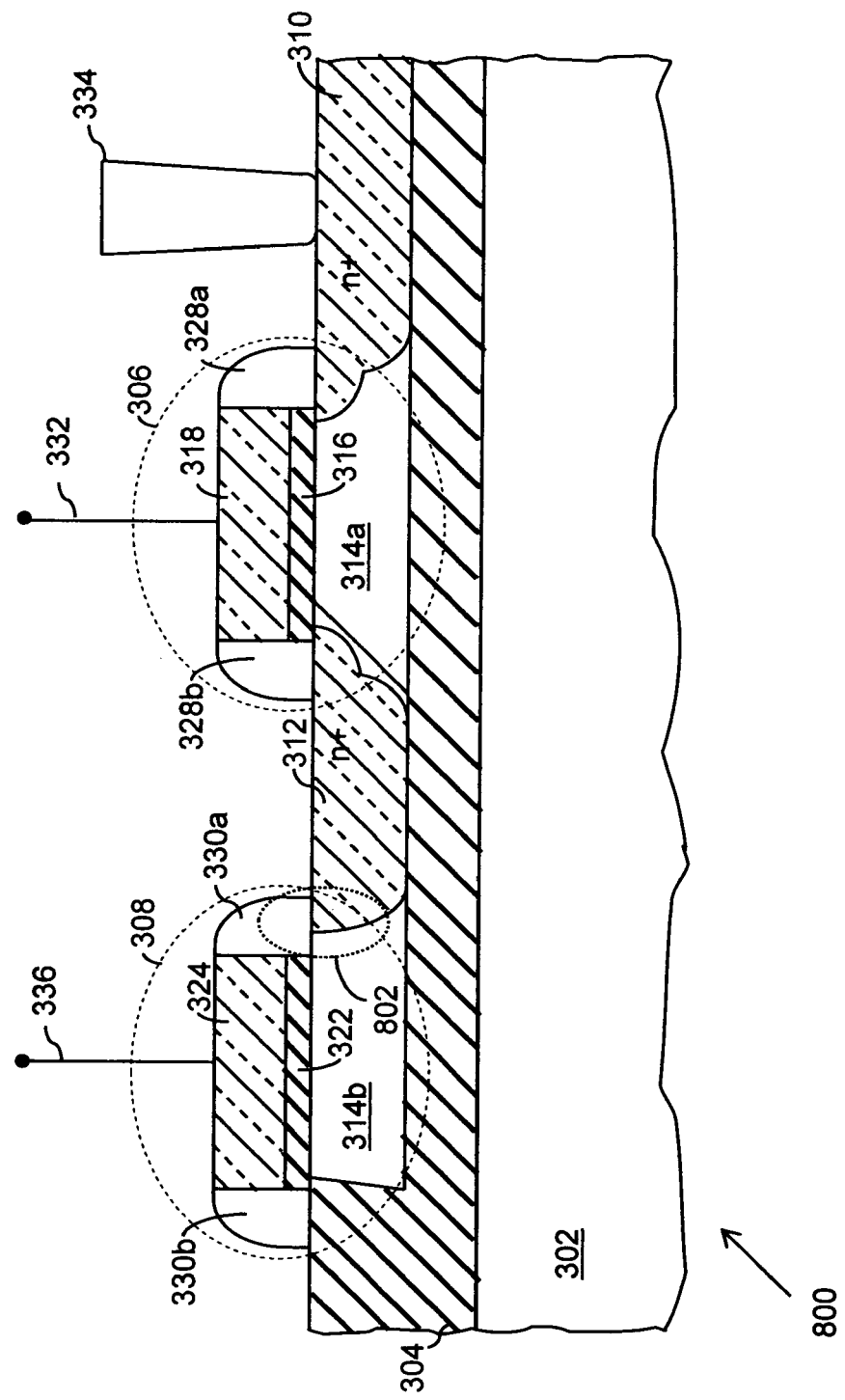
FIG. 8 illustrates a cross section of a memory cell, in accordance with yet another embodiment of the present invention.

FIG. 8 illustrates a cross section of an OTP memory cell 800, in accordance with yet another embodiment of the present invention. Memory cell 800 is a different embodiment of memory cell 600 shown in FIG. 6. The major difference between these two cells is that in memory cell 800, the shape of drain region 312 under spacer 330a is different from the shape depicted in FIG. 6. It will be apparent to a person ordinarily skilled in the art that the shape of drain region 312 shown in FIG. 8 is achieved by masking LDD and halo implants performed under insulating layer 322 for the formation of drain region 312.

The advantages of masking the LDD and halo implants have already been mentioned in FIG. 5. Further, the layout of memory cell 800 is the same as the layout of memory cell 600.

Figure 9:
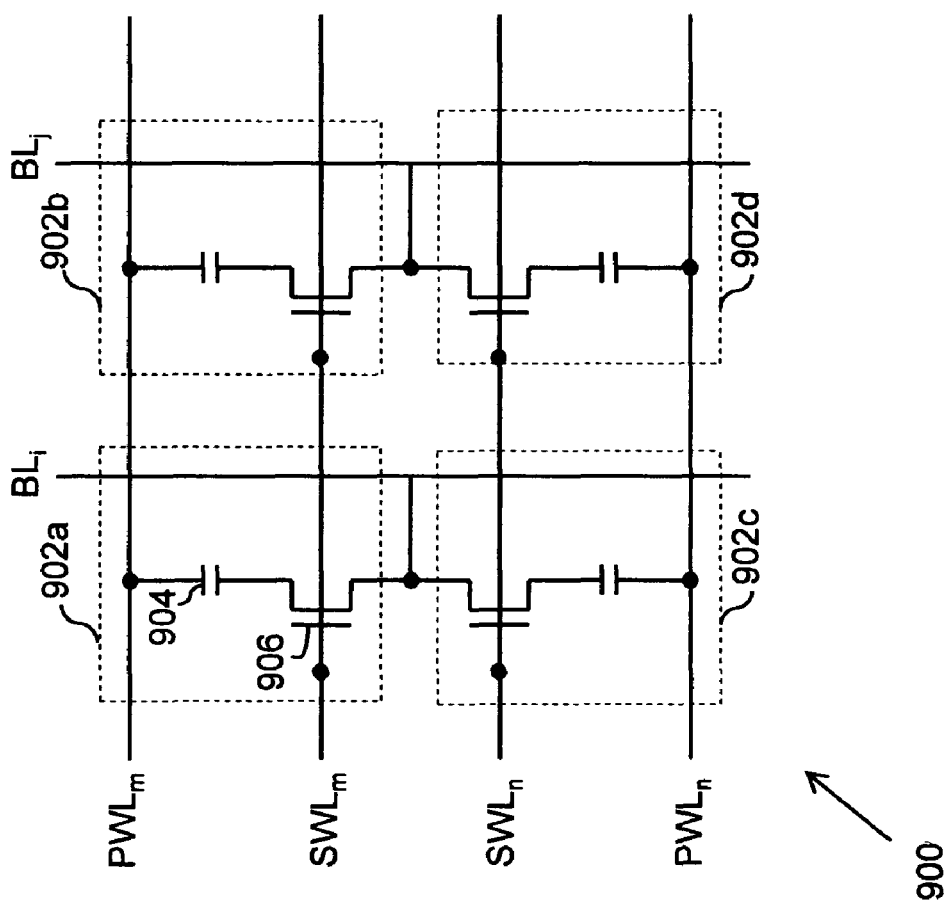
FIG. 9 is a schematic of a memory array, in accordance with an embodiment of the present invention.

FIG. 9 is a schematic of an exemplary memory array 900, in accordance with an embodiment of the present invention. Memory array 900 is shown to include four memory cells 902a, 902b, 902c, and 902d. Those ordinarily skilled in the art will appreciate that memory array 900 can have many more such memory cells connected to each other. The functioning of the memory cells and memory array 900 will not change even if more memory cells are included in the array.

To describe FIG. 9, references will be made to FIG. 10, which is a table illustrating a set of voltages for an OTP memory cell. It is to be noted that the values of voltages mentioned in the table of FIG. 10 are exemplary in nature, and will change based on the application of memory array 900 and the process by which memory array 900 is fabricated or designed.

During the programming operation of memory cell 902a, Vpp voltage is applied to the program word line PWLm, and Vpp/2 or Vpp/3 voltage is applied to the select word line SWLm. The reason behind applying a higher voltage to the program word line PWLm is that the programmable element, i.e., element 904 shown in FIG. 9, needs to be 'broken down' to program it a permanent 'one'.

During the programming operation, the bit line BLi of memory cells 902a and 902c is connected to zero potential, and the program word line PWLn of memory cells 902c and 902d is connected to any voltage level between 'zero' and Vpp/2. High voltage is not applied to the program word line of memory cells 902c and 902d because these memory cells are not getting programmed. Therefore, there is no need to break down their programmable elements. On similar reasoning, select word line SWLn of these two cells is connected to a zero potential.

The bit line BLj of memory cells 902b and 902d is connected to a voltage Vpp/3 or Vpp/2. The reason why bit line BLi is at 'zero' voltage and bit line BLj is at a voltage Vpp/3 or Vpp/2 is that the voltage difference between the terminals of programmable element of memory cell 902a needs to be high as compared with the voltage difference between the terminals of programmable elements of any other memory cells (since only memory cell 902a is being programmed).

The numerical value of Vpp depends on the structural details of the memory cells. For an insulating layer of programmable element 904 having a thickness of 0.6 nm to 3.5 nm, Vpp is preferred to be in the range of 3-9 volts.

During the read operation of memory cell 902a, Vread voltage is applied to the program word line PWLm, and Vdd is applied to the select word line SWLm. The bit line BLi is kept at the zero potential, and the program word line PWLn of memory cells 902c and 902d is connected to any voltage level between 'zero' and Vdd. Also, select word line SWLn is kept at the zero potential and the bit line BLj of memory cells 902b and 902d is connected to Vdd.

Similar to the programming process, the numerical value of Vread depends on the structure of memory cells. For an insulating layer of a programmable element 904 having a thickness of 0.6 nm to 3.5 nm, Vread is preferred to be in the range of 0.7 volts to 3.3 volts. Vdd applied to SWLm is sufficient to turn on field effect transistor 906 and provide a conduction path between PLWm and BLi. The value of current flowing through the said conduction path because of the potentials applied on PLWm and BLi indicates the state of memory cell 902a. For example, if programmable element 904 is broken during programming operation, non-zero current will flow in the conduction path, indicating that a high logic, i.e., 'one' is stored in memory cell 902a.

Various embodiments of the present invention provide many advantages. Firstly, a p-n junction is not formed in the programmable element of the memory cell. This ensures that the degradation of the memory cell does not take place over a long period of time. This ensures long life of the memory cell.

Secondly, the breakdown of the programmable element in the memory cell according to the present invention is not position dependent. The charge carriers experience less resistance in their flow beneath the gate insulator due to the presence of an n-well or the undoped region beneath the gate insulator of the programmable element of the memory cell. Therefore, the process of breakdown need not to be position dependent.

Thirdly, the fabrication of this new memory cell does not require any deviation from the standard CMOS process. Thus, the same infrastructure that manufactures conventional memory cells can be used to manufacture the memory cell according to the present invention.

While the preferred embodiments of the invention have been illustrated and described, it will be clear that the invention is not limited to these embodiments only. Numerous modifications, changes, variations, substitutions, and equivalents will be apparent to those skilled in the art without departing from the spirit and scope of the invention as described in the claims.

What is claimed is:

1. A programmable memory array comprising a plurality of memory cells, at least one memory cell of the plurality of memory cells comprising:
   an isolation layer formed of a dielectric material;
   a field effect transistor comprising:
      a first semiconductor region of a first conductivity type and a second semiconductor region of the first conductivity type, wherein the first semiconductor region and the second semiconductor region are formed over the isolation layer;
      a channel region of a second conductivity type formed between the first semiconductor region and the second semiconductor region;
      a first gate insulator overlying the channel region; and
      a first conductive gate overlying the first gate insulator;
   a programmable element comprising:
      a third semiconductor region of the first conductivity type;
      the second semiconductor region of the first conductivity type;
      a semiconductor body present between the second semiconductor region and the third semiconductor region, wherein the third semiconductor region and the semiconductor body are formed over the isolation layer, and, wherein the semiconductor body of the programmable element is undoped;
      a second gate insulator overlying the semiconductor body; and
      a second conductive gate present over the second gate insulator;
   a bit line in contact with the first semiconductor region;
   a select word line coupled to the first conductive gate; and
   a program word line coupled to the second conductive gate.

2. The programmable memory array of claim 1, wherein the programmable memory array is a one-time programmable memory array.

3. The programmable memory array of claim 1, wherein the first conductivity type is N-type and the second conductivity type is P-type.

4. The programmable memory array of claim 1, wherein the semiconductor body of the programmable element is N-type doped.

5. The programmable memory array of claim 1, wherein the first semiconductor region is the source region of the field effect transistor and the second semiconductor region is the drain region of the field effect transistor.

6. The programmable memory array of claim 1, wherein the thickness of the second gate insulator of the programmable element is less than the thickness of the first gate insulator of the field effect transistor.

7. The programmable memory array of claim 1, wherein the isolation layer is formed over a substrate and the isolation layer is vertically extended upwards in a region adjacent to the third semiconductor region.

8. The programmable memory array of claim 7, wherein the third semiconductor region is present between the vertically extended region of the isolation layer and the semiconductor body.

9. A programmable memory array comprising a plurality of memory cells, at least one memory cell of the plurality of memory cells comprising:
   an isolation layer formed of a dielectric material;
   a field effect transistor comprising:
      a first semiconductor region of a first conductivity type and a second semiconductor region of the first conductivity type, wherein the first semiconductor region and the second semiconductor region are formed over the isolation layer;
      a channel region of a second conductivity type present between the first semiconductor region and the second semiconductor region;
      a gate insulator overlying the channel region; and
      a first conductive gate overlying the gate insulator;
   a programmable element comprising:
      the second semiconductor region of the first conductivity type;

a third region present over the isolation layer, wherein the third region is formed of the dielectric material;

a semiconductor body present over the isolation layer, wherein the semiconductor body is present between the second semiconductor region and the third region, and wherein the semiconductor body of the programmable element is undoped;

an insulator layer overlying the semiconductor body; and a second conductive gate present over the insulator layer;

a bit line in contact with the first semiconductor region;

a select word line coupled to the first conductive gate of the field effect transistor; and a program word line coupled to the second conductive gate of the programmable element.

10. The programmable memory array of claim 9, wherein the programmable memory array is a one-time programmable memory array.

11. The programmable memory array of claim 9, wherein the third region is extended downwards to the isolation layer.

12. The programmable memory array of claim 9, wherein the first conductivity type is N-type and the second conductivity type is P-type.

13. The programmable memory array of claim 9, wherein the semiconductor body of the programmable element is N-type doped.

14. The programmable memory array of claim 9, wherein the first semiconductor region is the source region of the field effect transistor and the second semiconductor region is the drain region of the field effect transistor.

15. The programmable memory array of claim 9, wherein the thickness of the insulator layer of the programmable element is less than the thickness of the gate insulator of the field effect transistor.

16. The programmable memory array of claim 9, wherein the isolation layer is formed over a substrate.

* * * * *